(12) United States Patent
Myung et al.

(10) Patent No.: US 8,286,065 B2
(45) Date of Patent: Oct. 9, 2012

(54) METHOD AND APPARATUS FOR CHANNEL ENCODING AND DECODING IN A COMMUNICATION SYSTEM USING LOW-DENSITY PARITY-CHECK CODES

(75) Inventors: Seho Myung, Suwon-si (KR); Hwan-Joon Kwon, Suwon-si (KR); Jae-Yoel Kim, Suwon-si (KR); Yeon-Ju Lim, Seoul (KR); Sung-Ryul Yun, Suwon-si (KR); Hak-Ju Lee, Incheon (KR); Hong-Sil Jeong, Seoul (KR)

(73) Assignee: Samsung Electronics Co., Ltd (KR)

( * ) Notice: Subject to any disclaimer, the term of this patent is extended or adjusted under 35 U.S.C. 154(b) by 809 days.

(21) Appl. No.: 12/369,504

(22) Filed: Feb. 11, 2009

(65) Prior Publication Data
US 2009/0204869 A1    Aug. 13, 2009

(30) Foreign Application Priority Data

Feb. 11, 2008  (KR) .................. 10-2008-0012392
Mar. 14, 2008  (KR) .................. 10-2008-0023846

(51) Int. Cl.
*H03M 13/03* (2006.01)
(52) U.S. Cl. ....................................... 714/790
(58) Field of Classification Search .......... 714/701, 714/746, 786, 790, 800–801
See application file for complete search history.

(56) References Cited

U.S. PATENT DOCUMENTS

| | | | |
|---|---|---|---|
| 6,621,873 B1 | 9/2003 | Kim et al. | |
| 7,451,361 B2 * | 11/2008 | Schmidt | 714/701 |
| 7,581,159 B2 * | 8/2009 | Hocevar | 714/790 |
| 7,865,812 B2 * | 1/2011 | Liou et al. | 714/790 |
| 2002/0032890 A1 | 3/2002 | Rowitch et al. | |
| 2005/0283707 A1 | 12/2005 | Sharon et al. | |
| 2006/0123277 A1 | 6/2006 | Hocevar | |
| 2006/0156181 A1 | 7/2006 | Ha et al. | |
| 2007/0113147 A1 | 5/2007 | Hong et al. | |

(Continued)

FOREIGN PATENT DOCUMENTS

CA          2550761        *    1/2001

(Continued)

OTHER PUBLICATIONS

Draft ETSI EN 302 307 V1.1.1, "Digital Video Broadcasting (DVB); Second Generation Framing Structure, Channel Coding and Modulation Systems for Broadcasting, Interactive Services, News Gathering and other Broadband Satellite Applications", Jun. 2004, p. 1 to 74.

(Continued)

*Primary Examiner* — Shelly A Chase
(74) *Attorney, Agent, or Firm* — The Farrell Law Firm, P.C.

(57) ABSTRACT

An apparatus and method for encoding a channel in a communication system using a Low-Density Parity-Check (LDPC) code. The method includes determining a number of parity bits to be subjected to puncturing; dividing the parity bits at predetermined intervals, and determining a number of puncturing bits, which are subjected to puncturing within the predetermined intervals; determining positions of puncturing parity bits corresponding to the determined number of puncturing bits; and repeatedly performing puncturing on the puncturing parity bits corresponding to the determined positions at the predetermined intervals. The predetermined intervals are determined by dividing a length of parity bits by a length of one column group in a parity-check matrix.

17 Claims, 10 Drawing Sheets

U.S. PATENT DOCUMENTS

2007/0226583 A1  9/2007  Kim et al.

FOREIGN PATENT DOCUMENTS

| EP | 1 267 345 | 12/2002 |
| EP | 1 793 502 | 6/2007 |
| KR | 1020060047842 | 5/2006 |
| KR | 1020070046476 | 5/2007 |
| KR | 1020070054088 | 5/2007 |
| RU | 2 185 025 | 7/2002 |
| RU | 2 235 424 | 8/2004 |
| TW | 200637167 | 10/2006 |
| TW | 200644444 | 12/2006 |
| WO | WO 00/21234 | 4/2000 |
| WO | WO 2006/079081 | 7/2006 |

OTHER PUBLICATIONS

Tian Tao et al., "Construction of Rate-Compatible LDPC Codes Utilizing Information Shortening and Parity Puncturing", Journal on Wireless Communications and Networking, vol. 5, Jan. 1, 2005.

Fei Zesong et al., "A Type-II Hybrid ARQ Scheme Based on Rate-Compatible LDPC Code", 2006 International Conference on Communications, Circuits and Systems Proceedings, pp. 879-882, Jun. 1, 2006.

"IEEE Standard for Local and Metropolitan Area Networks Part 16: Air Interface for Fixed and Mobile Broadband Wireless Access Systems Amendment 2: Physical and Medium Access Control Layers for Combined Fixed and Mobile. Operation in Licensed Bands and Corrigendum 1", Internet Article, Feb. 18, 2006.

* cited by examiner $$H_1 = \begin{bmatrix} 1 & 1 & 1 & 1 & 1 & 1 & 0 & 0 \\ 1 & 1 & 0 & 1 & 0 & 1 & 1 & 0 \\ 1 & 1 & 1 & 0 & 0 & 0 & 1 & 1 \\ 1 & 0 & 1 & 1 & 1 & 0 & 0 & 1 \end{bmatrix}$$

METHOD AND APPARATUS FOR CHANNEL ENCODING AND DECODING IN A COMMUNICATION SYSTEM USING LOW-DENSITY PARITY-CHECK CODES

PRIORITY

This application claims priority under 35 U.S.C. §119(a) to a Korean Patent Application filed in the Korean Intellectual Property Office on Feb. 11, 2008 and assigned Serial No. 10-2008-0012392, and a Korean Patent Application filed in the Korean Intellectual Property Office on Mar. 14, 2008 and assigned Serial No. 10-2008-0023846, the disclosures of which are incorporated herein by reference.

BACKGROUND OF THE INVENTION

1. Field of the Invention

The present invention relates generally to a communication system using Low-Density Parity-Check (LDPC) codes, and in particular, to a channel encoding/decoding method and apparatus for generating LDPC codes of a particular type.

2. Description of the Related Art

In wireless communication systems, link performance significantly decreases due to various noises in channels, a fading phenomenon, and Inter-Symbol Interference (ISI). Therefore, in order to realize high-speed digital communication systems, which require high data throughput and reliability, such as the next-generation mobile communication, digital broadcasting, and portable internet, it is important to develop technology for overcoming the channel noises, fading, and ISI. Recently, an intensive study of an error-correcting code has been conducted as a method for increasing communication reliability by efficiently recovering distorted information.

An LDPC code is typically represented using a graph representation technique, and many characteristics can be analyzed through the methods based on graph theory, algebra, and probability theory. Generally, a graph model of channel codes is useful for description of codes, and by mapping information on encoded bits to vertexes in the graph and mapping relations between the bits to edges in the graph, it is possible to consider a communication network in which the vertexes exchange predetermined messages through the edges, thus making it possible to derive a natural decoding algorithm. For example, a decoding algorithm derived from a trellis, which can be regarded as a kind of graph, can include the well-known Viterbi algorithm and a Bahl, Cocke, Jelinek and Raviv (BCJR) algorithm.

The LDPC code is generally defined as a parity-check matrix, and can be expressed using a bipartite graph, which is referred to as a Tanner graph. The bipartite graph means that vertexes of the graph are divided into two different types, and the LDPC code is represented by the bipartite graph including vertexes, some of which are called variable nodes and the other of which are called check nodes. The variable nodes are one-to-one mapped to the encoded bits.

FIG. 1 illustrates an example of a parity-check matrix $H_1$ of the LDPC code including 4 rows and 8 columns. Referring to FIG. 1, because the number of columns is 8, the parity-check matrix $H_1$ indicates that an LDPC code that generates a length-8 codeword, and the columns are mapped to 8 encoded bits.

FIG. 2 is a diagram illustrating a Tanner graph corresponding to $H_1$ of FIG. 1.

Referring to FIG. 2, the Tanner graph of the LDPC code includes 8 variable nodes $x_1$ (202), $x_2$ (204), $x_3$ (206), $x_4$ (208), $x_5$ (210), $x_6$ (212), $x_7$ (214), and $x_8$ (216), and 4 check nodes 218, 220, 222, and 224. An $i^{th}$ column and a $j^{th}$ row in the parity-check matrix $H_1$ of the LDPC code are mapped to a variable node $x_i$ and a $j^{th}$ check node, respectively. In addition, a value of 1, i.e., a non-zero value, at the point where an $i^{th}$ column and a $j^{th}$ row in the parity-check matrix $H_1$ of the LDPC code cross each other, indicates that there is an edge between the variable node $x_i$ and the $j^{th}$ check node on the Tanner graph of FIG. 2.

In the Tanner graph of the LDPC code, a degree of the variable node and the check node indicates the number of edges connected to each respective node, and the degree is equal to the number of non-zero entries in a column or row corresponding to the associated node in the parity-check matrix of the LDPC code. For example, in FIG. 2, degrees of the variable nodes $x_1$ (202), $x_2$ (204), $x_3$ (206), $x_4$ (208), $x_5$ (210), $x_6$ (212), $x_7$ (214), and $x_8$ (216) are 4, 3, 3, 3, 2, 2, 2, and 2, respectively, and degrees of check nodes 218, 220, 222, and 224 are 6, 5, 5, and 5, respectively. In addition, the numbers of non-zero entries in the columns of the parity-check matrix $H_1$ of FIG. 1, which correspond to the variable nodes of FIG. 2, coincide with their degrees 4, 3, 3, 3, 2, 2, 2, and 2, and the numbers of non-zero entries in the rows of the parity-check matrix $H_1$ of FIG. 1, which correspond to the check nodes of FIG. 2, coincide with their degrees 6, 5, 5, and 5.

In order to express degree distribution for the nodes of the LDPC code, a ratio of the number of degree-i variable nodes to the total number of variable nodes is defined as $f_i$, and a ratio of the number of degree-j check nodes to the total number of check nodes is defined as $g_j$. For example, for the LDPC code corresponding to FIGS. 1 and 2, $f_2=4/8$, $f_3=3/8$, $f_4=1/8$, and $f_i=0$ for $i \ne 2, 3, 4$; and $g_5=3/4$, $g_6=1/4$, and $g_j=0$ for $j \ne 5, 6$. When a length of the LDPC code is defined as N, i.e., the number of columns is defined as N, and when the number of rows is defined as N/2, the density of non-zero entries in the entire parity-check matrix having the above degree distribution is computed as shown Equation (1).

$$\frac{2f_2 N + 3f_3 N + f_4 N}{N \cdot N/2} = \frac{5.25}{N} \quad (1)$$

In Equation (1), as N increases, the density of 1's in the parity-check matrix decreases. Generally, as for the LDPC code, because the code length N is inversely proportional to the density of non-zero entries, the LDPC code with a large N has a very low density of non-zero entries. The term "low-density" in the name of the LDPC code originates from the above-mentioned relationship.

FIG. 3 schematically illustrates an LDPC code adopted as the standard technology in Digital Video Broadcasting-Satellite transmission $2^{nd}$ generation (DVB-S2), which is one of the European digital broadcasting standards.

In FIG. 3, $N_1$ denotes a length of an LDPC codeword, $K_1$ provides a length of an information word, and $(N_1-K_1)$ provides a parity length. Further, integers $M_1$ and q are determined to satisfy $q=(N_1-K_1)/M_1$. Preferably, $K_1/M_1$ should also be an integer. For convenience, the parity-check matrix of FIG. 3 is called a first parity-check matrix $H_1$.

Referring again to FIG. 3, a structure of a parity part, i.e., $K_1^{th}$ column through $(N_1-1)^{th}$ column, in the parity-check matrix, has a dual diagonal shape. Therefore, as for degree distribution over columns corresponding to the parity part, all columns have a degree '2', except for the last column having a degree '1'.

In the parity-check matrix, a structure of an information part, i.e., $0^{th}$ column through $(K_1-1)^{th}$ column, is made using the following rules.

Rule 1: It generates a total of $K_1/M_1$ column groups by grouping $K_1$ columns corresponding to the information word in the parity-check matrix into multiple groups each including $M_1$ columns. A method for forming columns belonging to each column group follows Rule 2 below.

Rule 2: It first determines positions of '1's in each $0^{th}$ column in $i^{th}$ column groups (where $i=1, \ldots, K_1/M_1$). When a degree of a $0^{th}$ column in each $i^{th}$ column group is denoted by $D_i$, if positions of rows with 1 are assumed to be $R_{i,0}^{(1)}$, $R_{i,0}^{(2)}, \ldots, R_{i,0}^{(1),)}$, positions $R_{i,j}^{(k)}$ ($k=1, 2, \ldots, D_i$) of rows with 1 are defined as shown in Equation (2), in a $j^{th}$ column (where $j=1, 2, \ldots, M_i-1$) in an $i^{th}$ column group.

$$R_{i,j}^{(k)} = R_{i,(j-1)}^{(k)} + q \bmod(N_1-K_1), \quad (2)$$

$k=1, 2, \ldots, D_i, i=1, \ldots, K_1/M_1, j=1, \ldots, M_1-1$

According to the above rules, it can be appreciated that degrees of columns belonging to an $i^{th}$ column group are all equal to $D_i$.

As a detailed example, for $N_1=30$, $K_1=15$, $M_1=5$, and $q=3$, three sequences for the information on the positions of rows with 1 for $0^{th}$ columns in 3 column groups can be expressed as follows. Herein, these sequences are called "weight-1 position sequences".

$R_{1,0}^{(1)}=0$, $R_{1,0}^{(2)}=1$, $R_{1,0}^{(3)}=2$,
$R_{2,0}^{(1)}=0$, $R_{2,0}^{(2)}=11$, $R_{2,0}^{(3)}=13$,
$R_{3,0}^{(1)}=0$, $R_{3,0}^{(2)}=10$, $R_{3,0}^{(3)}=14$.

Regarding the weight-1 position sequence for $0^{th}$ columns in each column group, only the corresponding position sequences can be expressed as follows for each column group. For example:

0 1 2

0 11 13

0 10 14.

In other words, the $i^{th}$ weight-1 position sequence in the $i^{th}$ line sequentially represents the information on the positions of rows with 1 for the $i^{th}$ column group.

It is possible to generate an LDPC code having the same concept as that of a DVB-S2 LDPC code of FIG. 4, by forming a parity-check matrix using the information corresponding to the detailed example, and Rules 1 and 2.

It is known that the DVB-S2 LDPC code designed in accordance with Rule 1 and Rule 2 can be efficiently encoded using the structural shape. Respective steps in a process of performing LDPC encoding using the DVB-S2 based parity-check matrix will be described below by way of example.

In the following description, as a detailed example, a DVB-S2 LDPC code with $N_1=16200$, $K_1=10800$, $M_1=360$, and $q=15$ undergoes an encoding process. For convenience, information bits having a length $K_1$ are represented as $(i_0, i_1, \ldots, i_{K_1-1})$, and parity bits having a length $(N_1-K_1)$ are expressed as $(p_0, p_1, \ldots, p_{N_1-K_1-1})$.

Step 1: An LDPC encoder initializes parity bits as follows:
$p_0=p_1=\ldots=p_{N_1-K_1-1}=0$ Step 2: The LDPC encoder reads information on a row where 1 is located in a column group from a 0 weight-1 position sequence out of the stored sequences indicating the parity-check matrix.

0 2084 1613 1548 1286 1460 3196 4297 2481 3369 3451 4620 2622

$R_{1,0}^{(1)}=0$, $R_{1,0}^{(2)}=2048$, $R_{1,0}^{(3)}=1613$, $R_{1,0}^{(4)}=1548$, $R_{1,0}^{(5)}=1286$,
$R_{1,0}^{(6)}=1460$, $R_{1,0}^{(7)}=3196$, $R_{1,0}^{(8)}=4297$, $R_{1,0}^{(9)}=2481$, $R_{1,0}^{(10)}=3369$,
$R_{1,0}^{(11)}=3451$, $R_{1,0}^{(12)}=4620$, $R_{1,0}^{(13)}=2622$.

The LDPC encoder updates particular parity bits $p_x$ in accordance with Equation (3), using the read information and the first information bit $i_0$. Herein, x is a value of $R_{1,0}^{(k)}$ for $k=1, 2, \ldots, 13$.

$p_0=p_0 \oplus i_0$, $p_{2084}=p_{2064} \oplus i_0$, $p_{1613}=p_{1613} \oplus i_0$, $p_{1548}=p_{1548} \oplus i_0$, $p_{1286}=p_{1286} \oplus i_0$, $p_{1460}=p_{1460} \oplus i_0$, $p_{3196}=p_{3196} \oplus i_0$, $p_{4297}=p_{4297} \oplus i_0$, $p_{2481}=p_{2481} \oplus i_0$, $p_{3369}=p_{3369} \oplus i_0$, $p_{3451}=p_{3451} \oplus i_0$, $p_{4620}=p_{4620} \oplus i_0$, $$p_{2622}=p_{2622} \oplus i_0 \quad (3)$$

In Equation (3), $p_x=p_x \oplus i_0$ can also be expressed as $p_x \leftarrow p_x \oplus i_0$, and $\oplus$ represents binary addition.

Step 3: The LDPC encoder first finds out a value of Equation (4) for the next 359 information bits $i_m$ (where $m=1, 2, \ldots, 359$) after $i_0$.

$$\{x+(m \bmod M_1) \times q\} \bmod(N_1-K_1), M_1=360, m=1, 2, \ldots, 359 \quad (4)$$

In Equation (4), x is a value of $R_{1,0}^{(k)}$ for $k=1, 2, \ldots, 13$. It should be noted that Equation (4) has the same concept as Equation (2).

Next, the LDPC encoder performs an operation similar to Equation (3) using the value found in Equation (4). That is, the LDPC encoder updates $p_{\{x+(m \bmod M_1) \times q\} \bmod(N_1-K_1)}$ for $i_m$. For example, for $m=1$, i.e., for $i_1$, the LDPC encoder updates parity bits $p_{(x+q) \bmod(N_1-K_1)}$ as defined in Equation (5).

$p_{15}=p_{15} \oplus i_1$, $p_{2099}=p_{2099} \oplus i_1$, $p_{1628}=p_{1628} \oplus i_1$, $p_{1563}=p_{1563} \oplus i_1$, $p_{1301}=p_{1301} \oplus i_1$, $p_{1475}=p_{1475} \oplus i_1$, $p_{3211}=p_{3211} \oplus i_1$, $p_{4312}=p_{4312} \oplus i_1$, $p_{2496}=p_{2496} \oplus i_1$, $p_{3384}=p_{3384} \oplus i_1$, $p_{3466}=p_{3466} \oplus i_1$, $p_{4635}=p_{4635} \oplus i_1$, $$p_{2637}=p_{2637} \oplus i_1 \quad (5)$$

It should be noted that $q=15$ in Equation (5). The LDPC encoder performs the above process for $m=1, 2, \ldots, 359$, in the same manner as shown above.

Step 4: As in Step 2, the LDPC encoder reads information of the $1^{st}$ weight-1 position sequence $R_{2,0}^{(k)}$ ($k=1, 2, \ldots, 13$) for a $361^{st}$ information bit $i_{360}$, and updates a particular $p_x$, where x is $R_{2,0}^{(k)}$. The LDPC encoder updates $p_{\{x+(m \bmod M_1) \times q\} \bmod(N_1-K_1)}$, $m=361, 362, \ldots, 719$ by similarly applying Equation (4) to the next 359 information bits $i_{361}$, $i_{362}, \ldots, i_{719}$ after $i_{360}$.

Step 5: The LDPC encoder repeats Steps 2, 3, and 4 for all groups each having 360 information bits.

Step 6: The LDPC encoder finally determines parity bits using Equation (6).

$$p_i=p_i \oplus p_{i-1}, i=1,2, \ldots, N_1-K_1-1 \quad (6)$$

The parity bits $p_i$ of Equation (6) are parity bits that underwent LDPC encoding.

As described above, DVB-S2 performs encoding through the process of Step 1 through Step 6.

In order to apply the LDPC code to the actual communication system, the LDPC code should be designed to be suitable for the data rate required in the communication system. Particularly, not only in an adaptive communication system employing Hybrid Automatic Retransmission Request (HARQ) and Adaptive Modulation and Coding (AMC), but also in a communication system supporting various broadcast services, LDPC codes having various codeword lengths are needed to support various data rates according to the system requirements.

However, as described above, the LDPC code used in the DVB-S2 system has only two types of codeword lengths due to its limited use, and each type of the LDPC code needs an independent parity-check matrix. For these reasons, there is a long-felt need in the art for a method for supporting various codeword lengths to increase extendibility and flexibility of the system. Particularly, in the DVB-S2 system, transmission of data having several hundreds to thousands of bits is needed for transmission of signaling information. However, because only 16200 and 64800 are available for a length of the DVB-S2 LDPC code, there is still a need for support of various codeword lengths.

In addition, because storing an independent parity-check matrix separately for each codeword length of the LDPC code reduces the overall memory efficiency, there is a demand for a scheme capable of efficiently supporting various codeword lengths from the given existing parity-check matrix, without designing a new parity-check matrix.

SUMMARY OF THE INVENTION

Accordingly, the present invention has been designed to address at least the problems and/or disadvantages and to provide at least the advantages described below. An aspect of the present invention is to provide a channel encoding/decoding method apparatus for generating LDPC codes having different codeword lengths from a given LDPC code, using shortening or puncturing in a communication system employing LDPC codes.

Another aspect of the present invention is to provide a channel encoding/decoding method and apparatus for guaranteeing the optimal performance with regard to DVB-S2 architecture in a communication system using LDPC codes.

In accordance with an aspect of the present invention, there is provided a method for encoding a channel in a communication system using a Low-Density Parity-Check (LDPC) code. The method includes determining a number of parity bits to be subjected to puncturing; dividing the parity bits at predetermined intervals, and determining a number of puncturing bits, which are subjected to puncturing within the predetermined interval; determining positions of puncturing parity bits corresponding to the determined number of puncturing bits within the predetermined interval; and repeatedly performing puncturing on the puncturing parity bits corresponding to the determined positions at the predetermined intervals. The predetermined interval is determined by dividing a length of parity bits by a length of one column group in a parity-check matrix.

In accordance with another aspect of the present invention, there is provided an apparatus for encoding a channel in a communication system using a Low-Density Parity-Check (LDPC) code. The apparatus includes a puncturing pattern applier for determining a number of parity bits to be subjected to puncturing, dividing the parity bits at predetermined intervals to determine a number of puncturing bits, which are subjected to puncturing within the predetermined interval, determining positions of puncturing parity bits corresponding to the determined number of puncturing bits within the predetermined interval, and repeatedly performing puncturing on the puncturing parity bits corresponding to the determined positions at the predetermined intervals. The predetermined interval is determined by dividing a length of parity bits by a length of one column group in a parity-check matrix.

In accordance with another aspect of the present invention, there is provided a method for decoding a channel in a communication system using a Low-Density Parity-Check (LDPC) code. The method includes demodulating a signal transmitted from a transmitter; determining whether there are any punctured bits in the demodulated signal; determining positions of punctured parity bits by estimating information on a puncturing pattern, when there are punctured bits; and decoding data using the determined positions of punctured parity bits.

In accordance with another aspect of the present invention, there is provided an apparatus for decoding a channel in a communication system using a Low-Density Parity-Check (LDPC) code. The apparatus includes a demodulator for demodulating a signal transmitted from a transmitter; a puncturing pattern decision unit for determining positions of punctured parity bits by estimating information on a puncturing pattern from the demodulated signal; and a decoder for decoding data using the determined positions of punctured parity bits.

BRIEF DESCRIPTION OF THE DRAWINGS

The above and other aspects, features, and advantages of the present invention will become more apparent from the following detailed description when taken in conjunction with the accompanying drawings in which.

DETAILED DESCRIPTION OF PREFERRED EMBODIMENTS

Embodiments of the present invention will now be described in detail with reference to the annexed drawings. In the following description, a detailed description of known functions and configurations incorporated herein may have been omitted for clarity and conciseness when their inclusion might obscure appreciation of the invention by a person of ordinary skill in the art.

The embodiments of the present invention provide a method and apparatus for supporting LDPC codes having various codeword lengths using a parity-check matrix of a structured LDPC code of a particular type. In addition, the embodiments of the present invention provide an apparatus for supporting various codeword lengths in a communication system using LDPC codes of a particular type, and a method for controlling the same. Particularly, the embodiments of the present invention provide a method and apparatus for generating an LDPC code using a parity-check matrix of a given LDPC code, the generated LDPC code being shorter in length than the given LDPC code.

Figure 5:
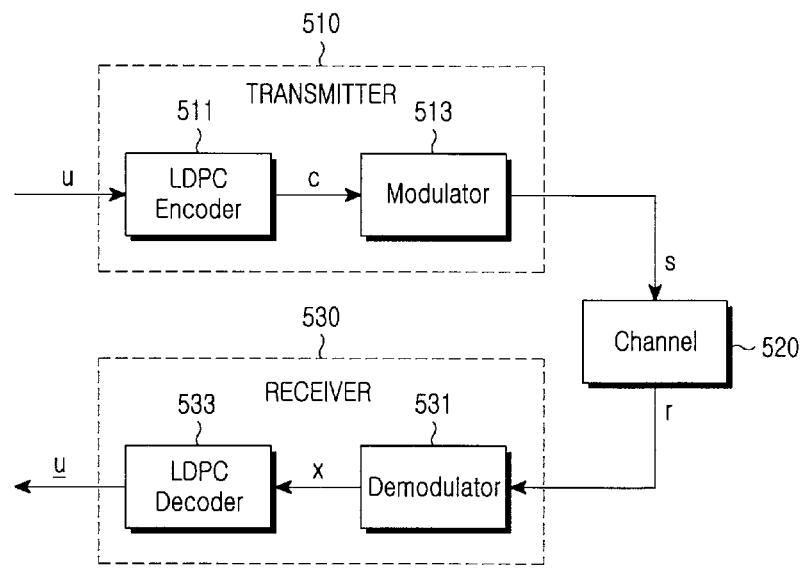
FIG. 5 is a block diagram illustrating a structure of a transceiver in a communication system using LDPC codes.

FIG. 5 is a block diagram illustrating a structure of a transceiver in a communication system using LDPC codes.

Referring to FIG. 5, a message u is input to an LDPC encoder 511 in a transmitter 510 before being transmitted to a receiver 530. The LDPC encoder 511 encodes the input message u, and outputs the encoded signal c to a modulator 513. The modulator 513 modulates the encoded signal c, and transmits the modulated signal s to the receiver 530 over a wireless channel 520. A demodulator 531 in the receiver 530 demodulates the received signal r, and outputs the demodulated signal x to an LDPC decoder 533. The LDPC decoder 533 estimates an estimation value u of the message based on the data received through the wireless channel 520.

The LDPC encoder 511 generates a parity-check matrix according to a codeword length required by a communication system, using a preset scheme. Particularly, in accordance with an embodiment of the present invention, the LDPC encoder 511 can support various codeword lengths using the LDPC code without the separate need for additional storage information.

In accordance with an embodiment of the present invention, a method of supporting various codeword lengths uses a shortening technique and/or a puncturing technique. The term "puncturing technique" as used herein indicates a method that does not substantially transmit a specified part of an LDPC codeword after generating the LDPC codeword from a given particular parity-check matrix by performing LDPC encoding. Hence, a receiver determines that the non-transmitted part was erased.

For a better understanding of the puncturing technique, a parity-check matrix of the DVB-S2 LDPC code illustrated in FIGS. 3 and 4 will be described in more detail below.

Figures 1, 2:
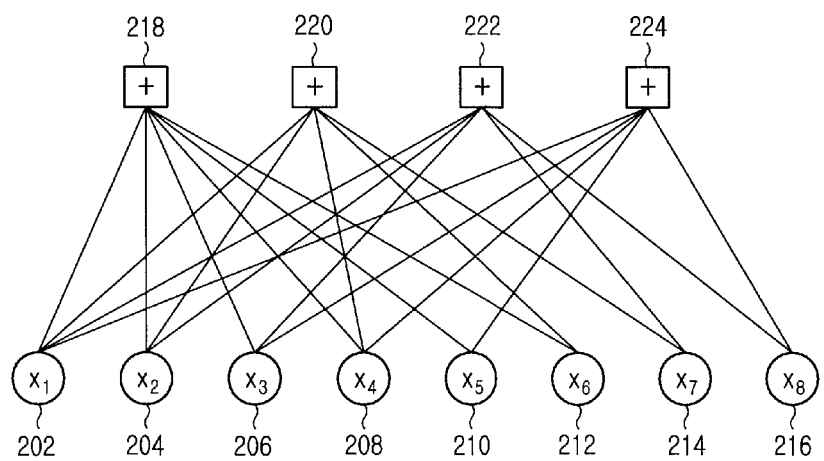
FIG. 1 is a diagram illustrating an example of a parity-check matrix of a length-8 LDPC code.
FIG. 2 is a diagram illustrating a Tanner graph for an example of the parity-check matrix of the length-8 LDPC code.
Figure 3:
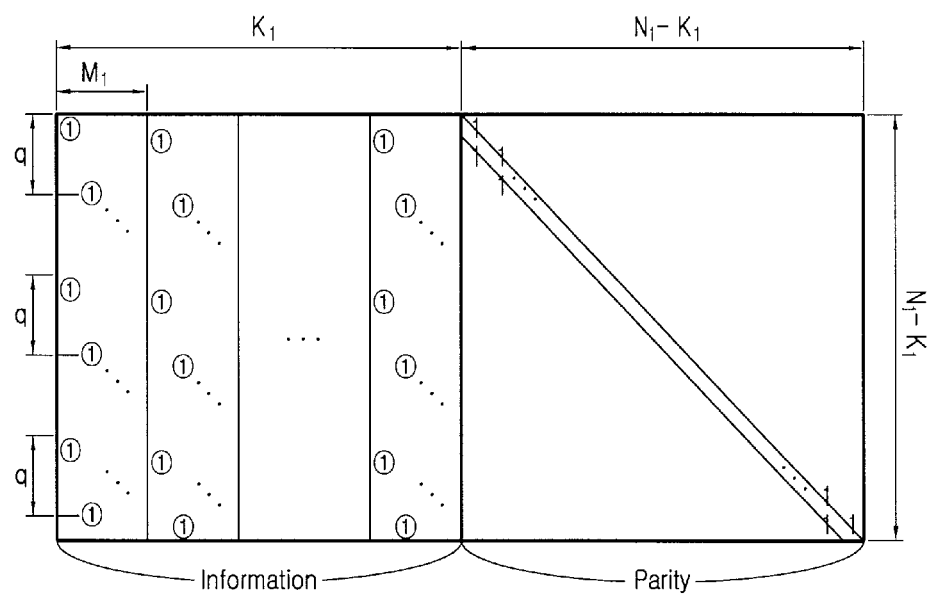
FIG. 3 is a diagram schematically illustrating a structure of a DVB-S2 LDPC code.

Regarding the parity-check matrix of the DVB-S2 LDPC code illustrated in FIG. 3, its total length is $N_1$, the leading part corresponds to length-$K_1$ information bits $(i_0, i_1, \ldots, i_{K_1-1})$, and the rear part corresponds to length-$(N_1-K_1)$ parity bits $(p_0, p_1, \ldots, p_{N_1-K_1-1})$.

Generally, the puncturing technique can be applied to both the information bits and the parity bits. Although the puncturing technique and the shortening technique commonly reduce codeword lengths, the puncturing technique, unlike the shortening technique, described herein above, does not limits values of particular bits. The puncturing technique is a method for simply not transmitting particular information bits or a particular part of generated parity bits, so that a receiver can erase the corresponding bits. In other words, by simply not transmitting bits in $N_p$ predefined positions in a generated length-$N_1$ LDPC codeword, the puncturing technique can obtain the same effect as that obtained by transmitting a length-$(N_1-N_p)$ LDPC codeword. Because columns corresponding to the bits punctured in the parity-check matrix are all used intact in a decoding process, the puncturing technique is distinct from the shortening technique.

Further, according to the invention, because position information for the punctured bits can be shared or estimated in common by the transmitter and the receiver when the system is set up, the receiver may merely erase the corresponding punctured bits, before decoding.

In the puncturing technique, because a length of a codeword that the transmitter actually transmits is $N_1-N_p$ and a length of an information word is constantly $K_1$, the code rate becomes $K_1/(N_1-N_p)$, which is always greater than the first given code rate $K_1/N_1$.

A description will now be made of a shortening technique and a puncturing technique suitable for the DVB-S2 LDPC code. The DVB-S2 LDPC code, as described above, is an LDPC code having a particular structure. Therefore, compared with the normal LDPC code, the DVB-S2 LDPC code is able to undergo more efficient shortening and puncturing.

For convenience of this example, it is assumed that a codeword length and an information length of an LDPC code are $N_2$ and $K_2$, respectively. If a definition of $N_1-N_2=N_\Delta$ and $K_1-K_2=K_\Delta$ is given, it is possible to generate the LDPC code whose codeword length and information length are $N_2$ and $K_2$, respectively, by shortening $K_\Delta$ bits and puncturing $N_p$ ($=N_\Delta-K_\Delta$) bits from the parity-check matrix of the DVB-S2 LDPC code. For the generated LDPC code with $N_\Delta > 0$ or $K_\Delta > 0$, because its code rate $$\frac{K_1 - K_\Delta}{N_1 - N_\Delta}$$

is generally different from the code rate $K_1/N_1$ of the DVB-S2 LDPC code, its algebraic characteristic changes. For $N_\Delta = K_\Delta$, the LDPC code is generated by not performing shortening and puncturing or by performing only shortening.

Figure 4:
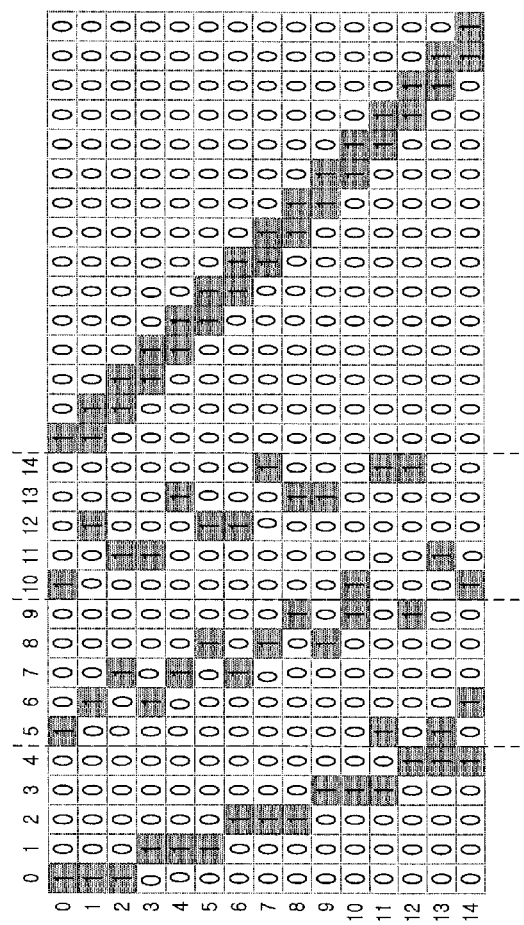
FIG. 4 is a diagram illustrating an example of a parity-check matrix of a DVB-S2 LDPC code.

With reference to FIG. 4, a detailed description will be made of characteristics of a DVB-S2 LDPC code to which parity puncturing is applied. It is to be noted that for the DVB-S2 LDPC code of FIG. 4, $N_1=30$, $K_1=15$, $M_1=5$, and $q=3$, and a weight-1 position sequence for $0^{th}$ columns in three column groups are as follows:

0 1 2

0 11 13

0 10 14

An $i^{th}$ weight-1 position sequence in an $i^{th}$ column sequentially represents the information on the positions of rows with 1 in an $i^{th}$ column group.

Figure 6:
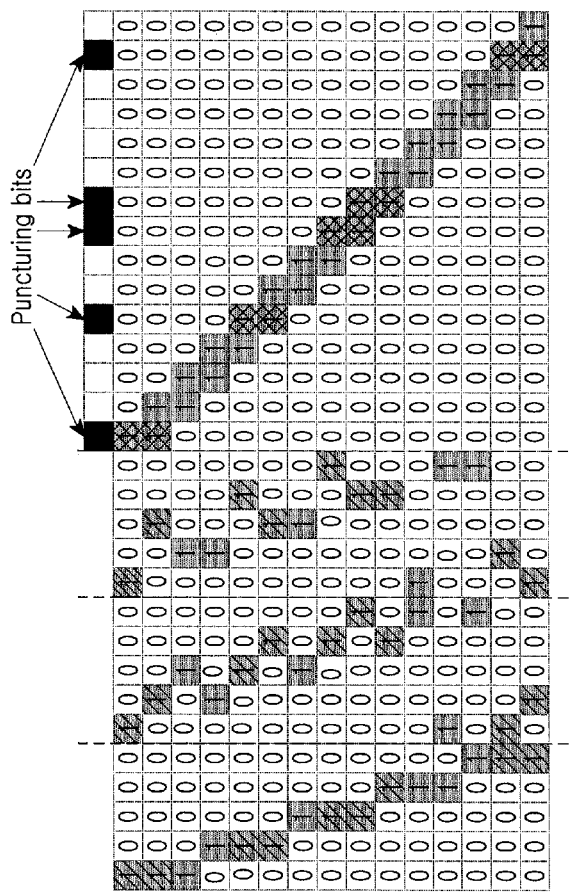
FIG. 6 is a diagram illustrating a first example where random puncturing is applied to the LDPC code of FIG. 4.

FIG. 6 is a diagram illustrating a first example where random puncturing is applied to the LDPC code of FIG. 4. Because the parity bits punctured in FIG. 6 are subjected to erasure processing at a decoder, the punctured parity bits, compared with the other non-erased bits, are not greater in a performance improvement effect in an LDPC decoding process, causing a decrease in reliability. Consequently, the other bits directly connected to the punctured parity bits, which are low in reliability, also suffer from a decrease in the performance improvement effect in the decoding process. The decrease in the performance improvement effect is more significant as the number of edges directly connected to the bits punctured on the Tanner graph is greater.

In FIG. 6, for example, a $0^{th}$ information bit corresponding to a $0^{th}$ column is directly connected to the punctured parity bit twice, a $3^{rd}$ information bit corresponding to a $3^{rd}$ column is directly connected to the punctured parity bit once, and an $8^{th}$ information bit corresponding to an $8^{th}$ column is directly connected to the punctured parity bit three times. In this case, the $3^{rd}$, $0^{th}$, and $8^{th}$ information bits are superior in the performance improvement effect in order in the decoding process. In other words, when the degrees of the variable nodes are equal to each other, the performance improvement effect is lower as the number of the connected punctured bits increases.

It can be appreciated from FIG. 6 that the number of punctured parity bits, which are directly connected to each information word by the random puncturing pattern, is random. Therefore, there is a high probability that reliability of each information bit will also be random. In other words, while some information bits may gain higher-than-needed decoding performance, other information bits may suffer significant performance degradation. This random puncturing pattern may lead to considerable irregularity of the reliability of the information bits in the decoding process.

Figure 7:
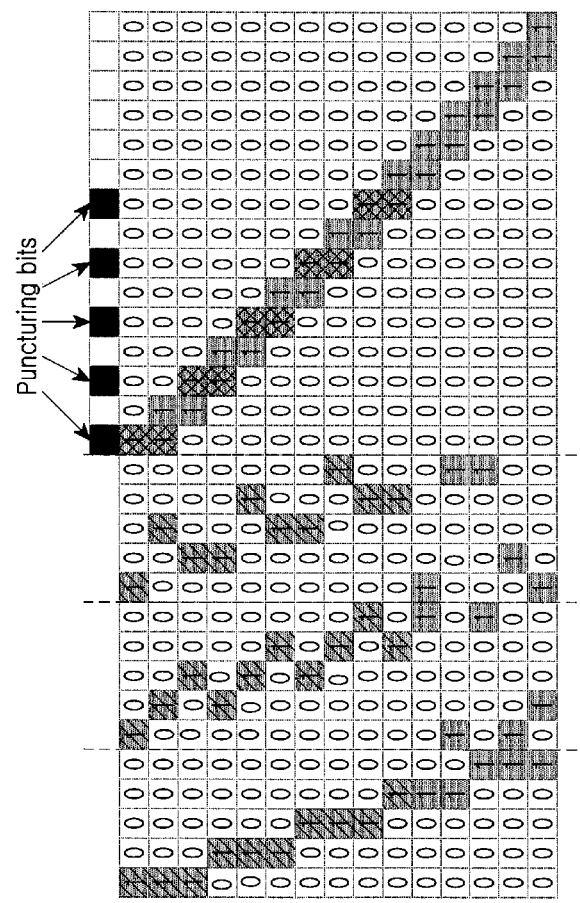
FIG. 7 is a diagram illustrating a second example where non-random puncturing is applied to the LDPC code of FIG. 4.

FIG. 7 is a diagram illustrating a second example where non-random puncturing is applied to the LDPC code of FIG. 4. More specifically, a relatively non-random puncturing pattern of a particular type is applied in the example illustrated in FIG. 7.

Referring to FIG. 7, even though the relatively non-random puncturing pattern is applied, the connections with the information bits may be irregular according to the corresponding puncturing pattern. The non-random puncturing pattern of FIG. 7 may be more irregular compared with the random puncturing pattern of FIG. 6.

In case of the LDPC code with a parity-check matrix having a particular structure like the DVB-S2 LDPC code, the connections between the information bits and the parity bits punctured according to the puncturing pattern can be significantly changed.

The embodiments of the present invention suggest a puncturing pattern that provides stable decoding performance by maximally suppressing the irregularity of the reliability of the information bits in the decoding process using the structural characteristics of the DVB-S2 LDPC code.

Figure 8:
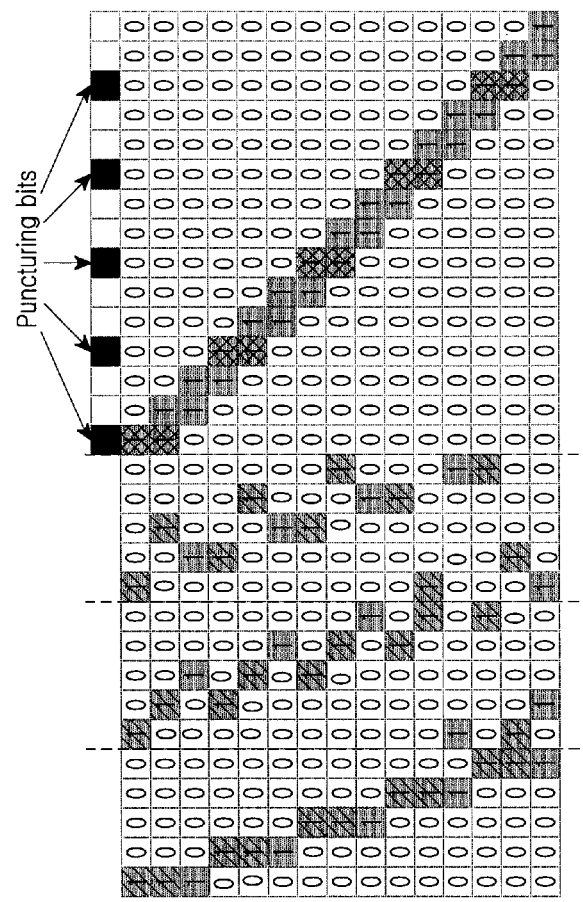
FIG. 8 is a diagram illustrating a third example where non-random puncturing is applied to the LDPC code of FIG. 4.

FIG. 8 is a diagram illustrating a third example where non-random puncturing is applied to the LDPC code of FIG. 4. In the example of FIG. 8, a puncturing pattern that maintains a constant interval of 3 between punctured parity bits because a value q is 3, which is one of the constituent variables, is applied to the parity-check matrix illustrated in FIG. 4. As can be seen in FIG. 8, each of all information bits is equally connected to 2 punctured bits.

The irregularity between the punctured bits and information bits is remarkably reduced when the interval between the punctured parity bits is set according to the value of q due to the structure of the DVB-S2 LDPC code. This is better described with reference to FIG. 3.

Referring to Rules 1and 2 and FIG. 3, regarding each column group, positions of '1's in the first column in the corresponding column group determine positions of '1's in the remaining columns. Indexes of rows where 1 is located in the remaining columns differ exactly by a multiple of q from an index of a row where 1 is located in the first column, in regard to modulo $(N_1-K_1)$, where $N_1$ denotes a length of an LDPC codeword and $K_1$ indicates a length of an information word. More specifically, indexes of rows where 1 is located in two consecutive columns in a particular column group differ from each other exactly by q, for modulo $(N_1-K_1)$.

Another characteristic of the DVB-S2 LDPC code lies in a submatrix corresponding to the parity in the parity-check matrix. Referring to FIG. 3, the parity part has a structure of a lower triangular matrix which 1 exists in all of diagonal parts, and in this structure, an $i^{th}$ parity bit corresponds to '1' located in an $i^{th}$ row.

Due to the structural characteristic of the DVB-S2 LDPC code, assuming that particular parity bits are punctured, if parity puncturing is repeated exactly at intervals of q, the number of edges of information bits connected to the parity bits punctured in a particular column group is regular to the utmost. For example, assuming that an $i^{th}$ parity bit is punctured for $0 \leq i < q$ and an $(i+kq)^{th}$ parity bit is repeatedly punctured for $0 \leq k < M_1$, an information bit being connected to the $i^{th}$ parity bit indicates that '1' exists in an $i^{th}$ row for a column corresponding to the corresponding information bit. Therefore, it can be understood that '1' exists in the $(i+kq)^{th}$ row in a column corresponding to an information bit which is separated by k from the above information bit among the columns in a column group according to Rule 1 and Rule 2. As a result, the information bit is connected to the punctured $(i+kq)^{th}$ bit.

For the DVB-S2 LDPC code, because degrees of variable nodes corresponding to all information words are equal to each other in one column group and one and less of '1' is distributed in one row, when the puncturing pattern is applied, the information bits corresponding to one column group are connected to a same number of punctured bits. Therefore, the connections between the punctured bits and the information bits become regular, so that stabilized decoding can be expected in the decoding process.

A general process for the application of the above-described puncturing scheme can be summarized as follows. In the following summary, it is assumed that $N_1$ indicates a length of an LDPC codeword, each column group has $M_1$ columns, and $N_p$ parity bits are subjected to puncturing. The following puncturing process is illustrated in FIG. 9.

Figure 9:
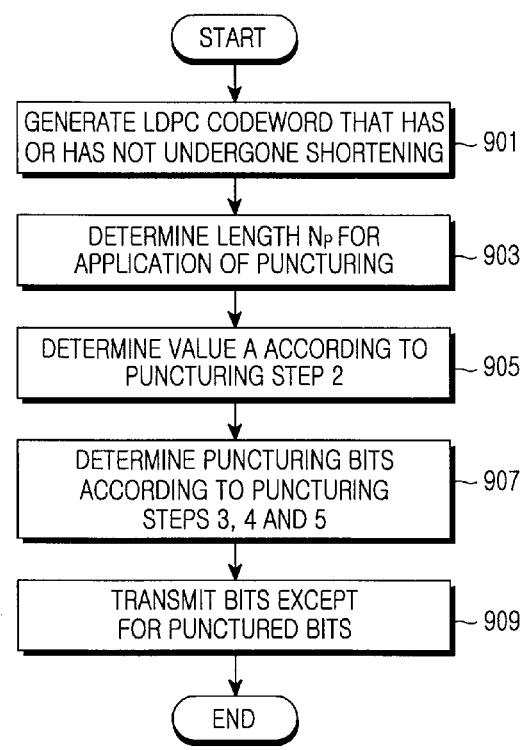
FIG. 9 is a flowchart illustrating a method for generating an LDPC code with a different codeword length from a parity-check matrix of a stored LDPC code according to an embodiment of the present invention.

More specifically, FIG. 9 is a flowchart illustrating a method for generating an LDPC code with a different codeword length from a parity-check matrix of a stored LDPC code according to an embodiment of the present invention.

Puncturing Step 1: A transmission apparatus generates, in step 901, an existing DVB-S2 LDPC codeword that has or has not undergone shortening.

Puncturing Step 2: The transmission apparatus determines a length $N_p$ by which it will perform puncturing, in step 903, and calculates $$A = \left\lfloor \frac{N_p}{M_1} \right\rfloor$$

in step 905, where $\lfloor x \rfloor$ is the maximum integer which is less than or equal to x.

Puncturing Step 3: The transmission apparatus determines parity bits $p_{i_0}, p_{i_1}, \ldots, p_{i_{A-1}}$ to be subjected to puncturing for $0 \leq x < A$ and $0 \leq i_x < q$ in step 907. It is assumed that for $0 \leq x < q$, values of $i_x$ were previously determined considering the performance (herein, a relationship of $A \leq q$ is given).

Puncturing Step 4: The transmission apparatus applies puncturing to all parity bits $p_{i_x+kqB}$ for $0 \leq x < A$ and $0 \leq k < M_1$ in step 907. Here, the constant B is a preset non-zero integer.

Puncturing Step 5: The transmission apparatus additionally punctures the parity bits $p_{i_A+kqB}$ for $0 \leq k < N_p - AM_1$ in step 907. Thereafter, the transmission apparatus transmits bits except for the punctured bits in step 909.

It can be understood that in the puncturing process, $AM_1$ parity bits are punctured in Puncturing Step 3 and Puncturing Step 4, and $(N_p - AM_1)$ parity bits are punctured in Puncturing Step 5, resulting in a total of $N_p$ parity bits being punctured. As to the DVB-S2 LDPC codeword transmitted after undergoing the puncturing, a reception apparatus restores a received signal to its original signal through a decoding process that will be described in more detail below referring to FIG. 10.

The following detailed example will be described for a better understanding of the puncturing process of Puncturing Step 3 through Puncturing Step 5. The DVB-S2 LDPC code used herein is a code with $N_1=16200$, $K_1=3240$, $M_1=360$, and $q=36$.

Example of Puncturing Step 1: A transmission apparatus generates the existing DVB-S2 LDPC codeword that has or has not undergone shortening.

Example of Puncturing Step 2: The transmission apparatus determines a length $N_p$ by which it will perform puncturing, and calculates $$A = \left\lfloor \frac{N_p}{M_1} \right\rfloor,$$

where $\lfloor x \rfloor$ is the maximum integer which is less than or equal to x.

Example of Puncturing Step 3: The transmission apparatus determines parity bits $p_{i_0}, p_{i_1}, \ldots, p_{i_{A-1}}$ to be subjected to puncturing for $0 \leq x < A$ and $0 \leq i_x < 36$. For $0 \leq x < 36$, values of $i_x$ are selected as follows using the connections between the punctured parity bits and the parity bits and the density evolution analysis method considering the case where the asymptotic performance is excellent.

27, 13, 29, 32, 5, 0, 11, 21, 33, 20, 25, 28, 18, 35, 8, 3, 9, 31, 22, 24, 7, 14, 17, 4, 2, 26, 16, 34, 19, 10, 12, 23, 1, 6, 30, 15

In the above sequence, an $x^{th}$ weight-1 position sequence corresponds to a value of $i_x$ for $0 \leq x < 36$.

Example of Puncturing Step 4: The transmission apparatus applies puncturing to all parity bits $p_{i_x+36k}$ for $0 \leq x < A$ and $0 \leq k < 360$. Here, a value of B is set to 1.

Example of Puncturing Step 5: The transmission apparatus supplementally punctures parity bits $p_{i_A+36k}$ for $0 \leq k < N_p - 360 \cdot A$.

It can be understood from Examples of Puncturing Step 1 through Puncturing Step 5 that the puncturing pattern can be defined accurately when the number $N_p$ of bits to be punctured, sequence information defining values of $i_x$, and a value of q are known.

When all parity bits of the DVB-S2 LDPC code applied to Examples of Puncturing Step 1 through Puncturing Step 5 are represented as $(p_0, p_1, p_2, \ldots, p_{12959})$, the examples of the puncturing steps can be summarized as shown in Table 1.

TABLE 1

| Major variables of DVB-S2 LDPC code | $N_1 = 16200$, $K_1 = 3240$, $M_1 = 360$, $q = 36$ |
|---|---|
| Grouping of parity bits | Define a set $P_j$ satisfying the following characteristics for $0 \leq j < q = 36$: $P_j = \{p_k | k \equiv j \bmod 36, 0 \leq k < 12960\}$. The set $P_j$ is a set having 360 parity bits as its entries. |
| Range of $N_p$ | Puncturing Method |
| $0 \leq N_p < 12960$ | For an integer $m = \left\lfloor \frac{N_p}{360} \right\rfloor$, puncture all of parity bits corresponding to m parity bit sets $P_{\pi(0)}$, $P_{\pi(1)}, \ldots, P_{\pi(m-1)}$, and additionally puncture $(N_p - 360\,m)$ parity bits among the parity bits corresponding to $P_{\pi(m)}$. Here, $\pi$ indicates a permutation function that is a puncturing pattern, and parity bits corresponding to parity bit sets are shown at the bottom of the table. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 27 | 13 | 29 | 32 | 5 | 0 | 11 | 21 | 33 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 20 | 25 | 28 | 18 | 35 | 8 | 3 | 9 | 31 |
| $\pi(18)$ | $\pi(19)$ | $\pi(20)$ | $\pi(21)$ | $\pi(22)$ | $\pi(23)$ | $\pi(24)$ | $\pi(25)$ | $\pi(26)$ |
| 22 | 24 | 7 | 14 | 17 | 4 | 2 | 26 | 16 |
| $\pi(27)$ | $\pi(28)$ | $\pi(29)$ | $\pi(30)$ | $\pi(31)$ | $\pi(32)$ | $\pi(33)$ | $\pi(34)$ | $\pi(35)$ |
| 34 | 19 | 10 | 12 | 23 | 1 | 6 | 30 | 15 |

As another embodiment of the puncturing steps, the puncturing pattern shown in Table 2 can be determined for a DVB-S2 LDPC code with $N_1=16200$, $K_1=7200$, $M_1=360$ and $q=25$.

TABLE 2

| Major variables of DVB-S2 LDPC code | $N_1 = 16200$, $K_1 = 7200$, $M_1 = 360$, $q = 25$ |
|---|---|
| Grouping of parity bits | Define a set $P_j$ satisfying the following characteristics for $0 \leq j < q = 25$: $P_j = \{p_k | k \equiv j \bmod 25, 0 \leq k < 9000\}$. The set $P_j$ is a set having 360 parity bits as its entries. |
| Range of $N_p$ | Puncturing Method |
| $0 \leq N_p < 9000$ | For an integer $m = \left\lfloor \frac{N_p}{360} \right\rfloor$, puncture all of parity bits corresponding to m parity bit sets $P_{\pi(0)}$, $P_{\pi(1)}, \ldots, P_{\pi(m-1)}$, and additionally puncture $(N_p - 360\,m)$ parity bits among the parity bits corresponding to $P_{\pi(m)}$. Here, $\pi$ indicates a permutation function that is a puncturing pattern, and parity bits corresponding to parity bit sets are shown at the bottom of the table. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 6 | 4 | 18 | 9 | 13 | 8 | 15 | 20 | 5 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 17 | 2 | 24 | 10 | 22 | 12 | 3 | 16 | 23 |
| $\pi(18)$ | $\pi(19)$ | $\pi(20)$ | $\pi(21)$ | $\pi(22)$ | $\pi(23)$ | $\pi(24)$ | | |
| 1 | 14 | 0 | 21 | 19 | 7 | 11 | — | — |

As described above, the embodiments of the present invention can apply the efficient puncturing technique capable of stabilizing performance of the DVB-S2 LDPC code using the structural characteristics of the DVB-S2 LDPC code, instead of applying an arbitrary puncturing technique or a simple regular puncturing technique that is commonly used for puncturing of the DVB-S2 LDPC code.

Referring again to a method for determining order of the bits punctured in Puncturing Step 3 for the DVB-S2 LDPC code, the method determines order of the punctured bits by using the density evolution analysis method and a cycle analysis method on the Tanner graph.

The puncturing technique contributes to an increased code rate because it changes a length of the LDPC codeword and also decreases the codeword length without changing a length of the information word. Therefore, the puncturing technique and also the shortening technique can be applied together to obtain the code rate and codeword length needed in the system.

As described above, when the codeword length and the information length of the LDPC code that the embodiments of the present invention intend to finally get from a given LDPC code with a codeword length $N_1$, and an information length $K_1$ using the shortening technique and the puncturing technique are denoted by $N_2$ and $K_2$, respectively, if a definition of $N_1-N_2=N_\Delta$ and $K_1-K_2=K_\Delta$ is given, the LDPC code with the codeword length $N_2$ and the information length $K_2$ can be generated by shortening $K_\Delta$ bits and puncturing $N_p(=N_\Delta-K_\Delta)$ bits from a parity-check matrix of the LDPC code. For the generated LDPC code, puncturing and shortening lengths can be set considering $N_2$ and $$\frac{K_1 - K_\Delta}{N_1 - N_\Delta},$$

because its code rate is $$\frac{K_1 - K_\Delta}{N_1 - N_\Delta}$$

for $N_\Delta>0$ or $K_\Delta>0$.

Figure 10:
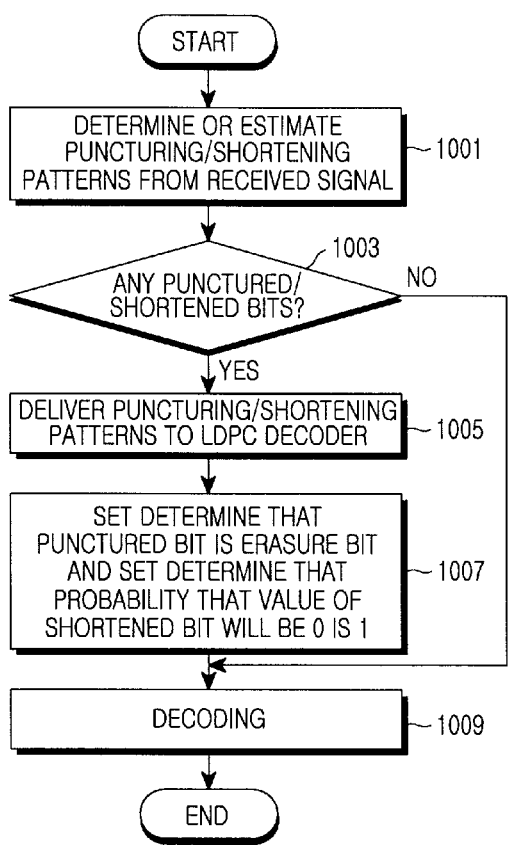
FIG. 10 is a flowchart illustrating an LDPC decoding method in a reception apparatus when a puncturing pattern is applied, according to an embodiment of the present invention.

FIG. 10 is a flowchart illustrating a reception method in a reception apparatus according to an embodiment of the present invention.

Referring to FIG. 10, the reception apparatus determines (or estimates) puncturing/shortening patterns from received signals in step 1001. Thereafter, the reception apparatus determines in step 1003 if there are any punctured or shortened bits.

If there are no punctured or shortened bits, the reception apparatus performs decoding in step 1009. However, if there are shortened or punctured bits, the reception apparatus delivers the puncturing/shortening patterns to an LDPC encoder 1160 in step 1005.

In step 1007, the LDPC encoder 1160 determines that punctured bits are erased bits and determines that probability that values of shortened bits will be zero (0) is 1. Thereafter, the LDPC encoder 1160 performs decoding.

Figure 11:
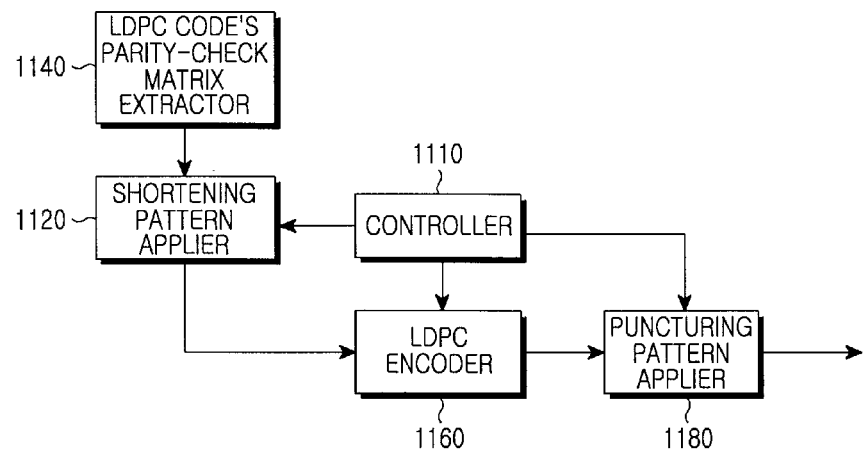
FIG. 11 is a block diagram illustrating a structure of a transmission apparatus that uses LDPC codes to which the puncturing and shortening proposed by the present invention is applied.

A detailed example of a transmission apparatus for implementing the puncturing process of the DVB-S2 LDPC code is illustrated in FIG. 11. More specifically, FIG. 11 illustrates a block diagram of a structure of a transmission apparatus that uses punctured/shortened LDPC codes according to an embodiment of the present invention.

Referring to FIG. 11, a transmission apparatus includes a controller 1110, a shortening pattern applier 1120, an LDPC code parity-check matrix extractor 1140, an LDPC encoder 1160, and a puncturing pattern applier 1180.

The LDPC code parity-check matrix extractor 1140 extracts an LDPC code parity-check matrix that underwent shortening. The LDPC code parity-check matrix can be extracted using a memory, can be given in the transmission apparatus, or can be generated in the transmission apparatus.

The controller 1110 controls the shortening pattern applier 1120 to determine a shortening pattern according to an information length, and the shortening pattern applier 1120 inserts bits having a value of 0 in positions corresponding to the shortened bits, or removes columns corresponding to the shortened bits from a parity-check matrix of a given LDPC code. The shortening pattern can be a shortening pattern stored in a memory, generated using a sequence generator (not shown), or acquired using a density evolution analysis algorithm for a parity-check matrix and a given information length.

The LDPC encoder 1160 performs encoding based on the LDPC code that underwent shortening by the controller 1110 and the shortening pattern applier 1120.

The controller 1110 controls the puncturing pattern applier 1180. The puncturing pattern applier 1180 determines a number of parity bits to be subjected to puncturing, divides the parity bits at predetermined intervals to determine a number of puncturing bits, which are subjected to puncturing within the predetermined interval, determines positions of puncturing parity bits corresponding to the determined number of puncturing bits within the predetermined interval, and repeatedly performs puncturing on the puncturing parity bits corresponding to the determined positions at the predetermined intervals.

Figure 12:
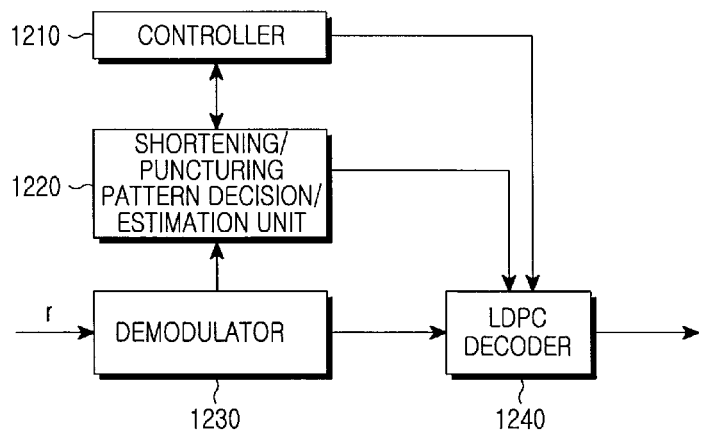
FIG. 12 is a block diagram illustrating a structure of a reception apparatus that uses LDPC codes to which the puncturing and shortening proposed by the present invention is applied.

FIG. 12 is a block diagram illustrating a structure of a reception apparatus according to an embodiment of the present invention. More specifically, the reception apparatus illustrated in FIG. 12 receives signals transmitted from a communication system that uses DVB-S2 LDPC codes that underwent puncturing or shortening, and recovers the data the user wants, from the received signals.

Referring to FIG. 12, the reception apparatus includes a controller 1210, a shortening/puncturing pattern decision/estimation unit 1220, a demodulator 1230, and an LDPC decoder 1240.

The demodulator 1230 receives and demodulates an LDPC code that underwent shortening, and delivers the demodulated signal to the shortening/puncturing pattern decision/estimation unit 1220 and the LDPC decoder 1240.

The shortening/puncturing pattern decision/estimation unit 1220, under control of the controller 1210, determines (or estimates) information about the puncturing or shortening pattern of an LDPC code from the demodulated signal, and delivers position information of the punctured and shortened bits to the LDPC decoder 1240 Determining or estimating the puncturing/shortening patterns in the shortening/puncturing pattern decision/estimation unit 1220 can use puncturing/shortening patterns stored in a memory, can generate puncturing/shortening patterns using a previously implemented generation method, or can obtain puncturing/shortening patterns using a density evolution analysis algorithm for a parity-check matrix and a given information length. The LDPC decoder 1240 performs erasure processing on the punctured bits and performs decoding thereon.

Further, when the transmission apparatus applies both shortening and puncturing, the shortening/puncturing pattern decision/estimation unit 1220 in the reception apparatus may carry out pattern determination or estimation on the shortening first, perform pattern determination or estimation on the puncturing first, or make pattern determination or estimation on both the shortening and puncturing.

The LDPC decoder 1240 performs decoding on the assumption that both the probability that the punctured bits would be zero (0) and the probability that the punctured bits would be 1 are equal to ½. Because the probability that values of the shortened bits will be zero is 1 (i.e. 100%), the LDPC decoder 1240 determines whether or not it will allow the shortened bits to take part in its decoding operation depending on the value 1 of the probability that the shortened bits would be zero.

When the LDPC decoder 1240 gets information on a length of the DVB-S2 LDPC code shortened by the shortening/puncturing pattern decision/estimation unit 1220, it restores the user desired data from the received signals.

From the transmission apparatus illustrated in FIG. 11, it can be appreciated that the shortening is performed in the input stage of the LDPC encoder 1160 and the puncturing is performed at the output stage of the LDPC encoder 1160. However, in the reception apparatus illustrated in FIG. 12, the LDPC decoder 1240 should receive information on both the puncturing and the shortening to make the decoding possible.

As is apparent from the foregoing description, the embodiments of the present invention can generate a separate LDPC code with a different codeword length using information on the parity-check matrix given in the communication system that uses an LDPC code.

In addition, the embodiments of the present invention can optimize performance of the DVB-S2 LDPC code by employing puncturing.

While the present invention has been shown and described with reference to embodiments thereof, it will be understood by those skilled in the art that various changes in form and details may be made therein without departing from the spirit and scope of the present invention as defined by the appended claims.

What is claimed is:

1. A method for encoding a channel in a communication system using a Low-Density Parity-Check (LDPC) code in a transmitter including a puncturing pattern applier, the method comprising:
   determining, by the puncturing pattern applier, a number of parity bits for puncturing;
   dividing the parity bits at predetermined intervals;
   determining a number of puncturing bits, which are subjected to puncturing within the predetermined intervals;
   determining positions of puncturing parity bits corresponding to the determined number of the puncturing bits within the predetermined intervals; and
   repeatedly performing puncturing on the puncturing parity bits corresponding to the determined positions at the predetermined intervals;
   wherein the predetermined intervals are determined by dividing a length of the parity bits by a length of one column group in a parity-check matrix.

2. The method of claim 1, wherein the positions of the puncturing parity bits are determined as 27, 13, 29, 32, 5, 0, 11, 21, 33, 20, 25, 28, 18, 35, 8, 3, 9, 31, 22, 24, 7, 14, 17, 4, 2, 26, 16, 34, 19, 10, 12, 23, 1, 6, 30, 15, when a codeword length is 16200 and an information length is 3240.

3. The method of claim 1, further comprising:
   additionally puncturing remaining parity bits except for the punctured parity bits when the number of the parity bits for puncturing is not a multiple of the length of the one column group.

4. A method for encoding a channel in a communication system using a Low-Density Parity-Check (LDPC) code in a transmitter including a puncturing pattern applier, the method comprising:
   determining, by the puncturing pattern applier, a number of parity bits for puncturing;
   performing puncturing on the determined number of the parity bits according to a predetermined puncturing pattern; and
   transmitting, by the transmitter, remaining bits, except for the punctured bits;
   wherein puncturing is applied to an LDPC code with a codeword length of 16200 and an information length of 3240 in accordance with a puncturing pattern defined as shown in the following table;

| Major variables of DVB-S2 LDPC code Grouping of parity bits | $N_1 = 16200, K_1 = 3240, M_1 = 360, q = 36$<br>Define a set $P_j$ satisfying the characteristics for $0 \leq j < q = 36$:<br>$P_j = \{p_k | k \equiv j \bmod 36, 0 \leq k < 12960\}$.<br>$P_j$ is a set having 360 parity bits as its entries. |
|---|---|
| Range of $N_p$ | Puncturing Method |
| $0 \leq N_p < 12960$ | For an integer $m = \lfloor \frac{N_p}{360} \rfloor$, puncture all of parity bits corresponding to m parity bit sets $P_{\pi(0)}$, $P_{\pi(1)}, \ldots, P_{\pi(m-1)}$, and additionally puncture $(N_p - 360\,m)$ parity bits among the parity bits corresponding to $P_{\pi(m)}$.<br>$\pi$ indicates a permutation function that is a puncturing pattern, and parity bits corresponding to parity bit sets are shown at the bottom of the table. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 27 | 13 | 29 | 32 | 5 | 0 | 11 | 21 | 33 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 20 | 25 | 28 | 18 | 35 | 8 | 3 | 9 | 31 |
| $\pi(18)$ | $\pi(19)$ | $\pi(20)$ | $\pi(21)$ | $\pi(22)$ | $\pi(23)$ | $\pi(24)$ | $\pi(25)$ | $\pi(26)$ |
| 22 | 24 | 7 | 14 | 17 | 4 | 2 | 26 | 16 |
| $\pi(27)$ | $\pi(28)$ | $\pi(29)$ | $\pi(30)$ | $\pi(31)$ | $\pi(32)$ | $\pi(33)$ | $\pi(34)$ | $\pi(35)$ |
| 34 | 19 | 10 | 12 | 23 | 1 | 6 | 30 | 15 | where $N_1$ denotes a length of an LDPC codeword, $K_1$ denotes a length of an information word, $M_1$ denotes a length of one column group, and q is an integer satisfying $q=(N_1-K_1)/M_1$, where $K_1/M_1$ is an integer.

5. A method for encoding a channel in a communication system using a Low-Density Parity-Check (LDPC) code in a transmitter including a puncturing pattern applier, the method comprising:
   determining, by the puncturing pattern applier, a number of parity bits for puncturing;
   performing puncturing on the determined number of parity bits according to a predetermined puncturing pattern; and
   transmitting, by the transmitter, remaining bits, except for the punctured bits;
   wherein puncturing is applied to an LDPC code with a codeword length of 16200 and an information length of 7200 in accordance with a puncturing pattern defined as shown the following table;

| | |
|---|---|
| Major variables of DVB-S2 LDPC code | $N_1 = 16200$, $K_1 = 7200$, $M_1 = 360$, $q = 25$ |
| Grouping of parity bits | Define a set $P_j$ satisfying characteristics for $0 \leq j < q = 25$: $P_j = \{p_k | k \equiv j \bmod 25, 0 \leq k < 9000\}$. $P_j$ is a set having 360 parity bits as its entries. |
| Range of $N_p$ | Puncturing Method |
| $0 \leq N_p < 9000$ | For an integer $m = \lfloor \frac{N_p}{360} \rfloor$, puncture all of parity bits corresponding to m parity bit sets $P_{\pi(0)}$, $P_{\pi(1)}, \ldots, P_{\pi(m-1)}$, and additionally puncture ($N_p - 360\,m$) parity bits among the parity bits corresponding to $P_{\pi(m)}$. $\pi$ indicates a permutation function that is a puncturing pattern, and parity bits corresponding to parity bit sets are shown at the bottom of the table. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 6 | 4 | 18 | 9 | 13 | 8 | 15 | 20 | 5 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 17 | 2 | 24 | 10 | 22 | 12 | 3 | 16 | 23 |
| $\pi(18)$ | $\pi(19)$ | $\pi(20)$ | $\pi(21)$ | $\pi(22)$ | $\pi(23)$ | $\pi(24)$ | — | — |
| 1 | 14 | 0 | 21 | 19 | 7 | 11 | — | — | where $N_1$ denotes a length of an LDPC codeword, $\text{IC}_1$ denotes a length of an information word, $M_1$ denotes a length of one column group, and q is an integer satisfying $q=(N_1-K_1)/M_1$, where $K_1/M_1$ is an integer.

6. An apparatus for encoding a channel in a communication system using a Low-Density Parity-Check (LDPC) code, the apparatus comprising:

a puncturing pattern applier for determining a number of parity bits for puncturing, dividing the parity bits at predetermined intervals to determine a number of puncturing bits, which are subjected to puncturing within the predetermined intervals, determining positions of puncturing parity bits corresponding to the determined number of puncturing bits within the predetermined intervals, and repeatedly performing puncturing on the puncturing parity bits corresponding to the determined positions at the predetermined intervals;

wherein the predetermined interval is determined by dividing a length of the parity bits by a length of one column group in a parity-check matrix.

7. The apparatus of claim 6, wherein in the positions of the puncturing parity bits are determined as 27, 13, 29, 32, 5, 0, 11, 21, 33, 20, 25, 28, 18, 35, 8, 3, 9, 31, 22, 24, 7, 14, 17, 4, 2, 26, 16, 34, 19, 10, 12, 23, 1, 6, 30, 15, when a codeword length is 16200 and an information length is 3240.

8. The apparatus of claim 6, wherein the puncturing pattern applier additionally punctures the parity bits when the number of parity for puncturing is not a multiple of the length of the one column group.

9. An apparatus for encoding a channel in a communication system using a Low-Density Parity-Check (LDPC) code, the apparatus comprising:

a puncturing pattern applier for determining a number of parity bits for puncturing, and performing puncturing on the determined number of parity bits according to a predetermined puncturing pattern; and a transmission unit for transmitting remaining bits, except for the punctured bits;

wherein puncturing is applied to an LDPC code with a codeword length of 16200 and an information length of 3240 in accordance with a puncturing pattern defined as shown in the following table;

| | |
|---|---|
| Major variables of DVB-S2 LDPC code | $N_1 = 16200$, $K_1 = 3240$, $M_1 = 360$, $q = 36$ |
| Grouping of parity bits | Define a set $P_j$ satisfying characteristics for $0 \leq j < 36$: $P_j = \{p_k | k \equiv j \bmod 36, 0 \leq k < 12960\}$. $P_j$ is a set having 360 parity bits as its entries. |
| Range of $N_p$ | Puncturing Method |
| $0 \leq N_p < 12960$ | For an integer $m = \lfloor \frac{N_p}{360} \rfloor$, puncture all of parity bits corresponding to m parity bit sets $P_{\pi(0)}$, $P_{\pi(1)}, \ldots, P_{\pi(m-1)}$, and additionally puncture ($N_p - 360\,m$) parity bits among the parity bits corresponding to $P_{\pi(m)}$. Here, $\pi$ indicates a permutation function that is a puncturing pattern, and parity bits corresponding to parity bit sets are shown at the bottom of the table. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 27 | 13 | 29 | 32 | 5 | 0 | 11 | 21 | 33 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 20 | 25 | 28 | 18 | 35 | 8 | 3 | 9 | 31 |
| $\pi(18)$ | $\pi(19)$ | $\pi(20)$ | $\pi(21)$ | $\pi(22)$ | $\pi(23)$ | $\pi(24)$ | $\pi(25)$ | $\pi(26)$ |
| 22 | 24 | 7 | 14 | 17 | 4 | 2 | 26 | 16 |
| $\pi(27)$ | $\pi(28)$ | $\pi(29)$ | $\pi(30)$ | $\pi(31)$ | $\pi(32)$ | $\pi(33)$ | $\pi(34)$ | $\pi(35)$ |
| 34 | 19 | 10 | 12 | 23 | 1 | 6 | 30 | 15 | where $N_1$ denotes a length of an LDPC codeword, $K_1$ denotes a length of an information word, $M_1$ denotes a length of one column group, and q is an integer satisfying $q=(N_1-K_1)/M_1$, where $K_1/M_1$ is an integer.

10. An apparatus for encoding a channel in a communication system using a Low-Density Parity-Check (LDPC) code, the apparatus comprising:

a puncturing pattern applier for determining a number of parity bits for puncturing, and performing puncturing on the determined number of parity bits according to a predetermined puncturing pattern; and a transmission unit for transmitting remaining bits, except for the punctured bits;

wherein puncturing is applied to an LDPC code with a codeword length of 16200 and an information length of 7200 in accordance with a puncturing pattern defined as shown in the following table;

| | |
|---|---|
| Major variables of DVB-S2 LDPC code | $N_1 = 16200$, $K_1 = 7200$, $M_1 = 360$, $q = 25$ |
| Grouping of parity bits | Define a set $P_j$ satisfying characteristics for $0 \leq j < q = 25$: $P_j = \{p_k | k \equiv j \bmod 25, 0 \leq k < 9000\}$. The set $P_j$ is a set having 360 parity bits as its entries. |

-continued

| Range of $N_p$ | Puncturing Method |
|---|---|
| $0 \leq N_p < 9000$ | For an integer $m = \left\lfloor \dfrac{N_p}{360} \right\rfloor$, puncture all of parity bits corresponding to m parity bit sets $P_{\pi(0)}$, $P_{\pi(1)}, \ldots, P_{\pi(m-1)}$, and additionally puncture $(N_p - 360 \, m)$ parity bits among the parity bits corresponding to $P_{\pi(m)}$. Here, $\pi$ indicates a permutation function that is a puncturing pattern, and parity bits corresponding to parity bit sets are shown at the bottom of the table. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 6 | 4 | 18 | 9 | 13 | 8 | 15 | 20 | 5 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 17 | 2 | 24 | 10 | 22 | 12 | 3 | 16 | 23 |
| $\pi(18)$ | $\pi(19)$ | $\pi(20)$ | $\pi(21)$ | $\pi(22)$ | $\pi(23)$ | $\pi(24)$ | — | — |
| 1 | 14 | 0 | 21 | 19 | 7 | 11 | — | — | where $N_1$ denotes a length of an LDPC codeword, $K_1$ denotes a length of an information word, $M_1$ denotes a length of one column group, and q is an integer satisfying $q=(N_1-K_1)/M_1$, where $K_1/M_1$ is an integer.

11. A method for decoding a channel in a communication system using a Low-Density Parity-Check (LDPC) code, the method comprising:

demodulating a signal transmitted from a transmitter;

determining if there are any punctured bits in the demodulated signal;

determining positions of punctured parity bits by estimating information on a puncturing pattern, when there are punctured bits in the demodulated signal; and decoding data using the determined positions of the punctured parity bits, wherein the determining positions of the punctured bits comprises:

determining a number of punctured bits; and determining positions of punctured bits corresponding to the determined number of the punctured bits in consideration of a predetermined interval, wherein the predetermined interval is determined by dividing a length of the parity bits by a length of one column group in a parity-check matrix.

12. The method of claim 11, wherein position values of the punctured parity bits are determined as 27, 13, 29, 32, 5, 0, 11, 21, 33, 20, 25, 28, 18, 35, 8, 3, 9, 31, 22, 24, 7, 14, 17, 4, 2, 26, 16, 34, 19, 10, 12, 23, 1, 6, 30, 15, when a codeword length is 16200 and an information length is 3240.

13. The method of claim 11, wherein the information on the puncturing pattern comprises a puncturing pattern defined as in the following table;

| Major variables of DVB-S2 LDPC code | $N_1 = 16200, K_1 = 3240, M_1 = 360, q = 36$ |
|---|---|
| Grouping of parity bits | Define a set $P_j$ satisfying characteristics for $0 \leq j < q = 36$: $P_j = \{p_k | k \equiv j \bmod 36, 0 \leq k < 12960\}$. $P_j$ is a set having 360 parity bits as its entries. |

| Range of $N_p$ | Puncturing Method |
|---|---|
| $0 \leq N_p < 12960$ | For an integer $m = \left\lfloor \dfrac{N_p}{360} \right\rfloor$, puncture all of parity bits corresponding to m parity bit sets $P_{\pi(0)}$, $P_{\pi(1)}, \ldots, P_{\pi(m-1)}$, and additionally puncture $(N_p - 360 \, m)$ parity bits among parity bits corresponding to $P_{\pi(m)}$. $\pi$ indicates a permutation function that is a puncturing pattern, and parity bits corresponding to parity bit sets are shown as follows. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 27 | 13 | 29 | 32 | 5 | 0 | 11 | 21 | 33 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 20 | 25 | 28 | 18 | 35 | 8 | 3 | 9 | 31 |
| $\pi(18)$ | $\pi(19)$ | $\pi(20)$ | $\pi(21)$ | $\pi(22)$ | $\pi(23)$ | $\pi(24)$ | $\pi(25)$ | $\pi(26)$ |
| 22 | 24 | 7 | 14 | 17 | 4 | 2 | 26 | 16 |
| $\pi(27)$ | $\pi(28)$ | $\pi(29)$ | $\pi(30)$ | $\pi(31)$ | $\pi(32)$ | $\pi(33)$ | $\pi(34)$ | $\pi(35)$ |
| 34 | 19 | 10 | 12 | 23 | 1 | 6 | 30 | 15 | where $N_1$ denotes a length of an LDPC codeword, $K_1$ denotes a length of an information word, $M_1$ denotes a length of one column group, and q is an integer satisfying $q=(N_1-K_1)/M_1$, where $K_1/M_1$ is an integer.

14. The method of claim 11, wherein the information on the puncturing pattern comprises a puncturing pattern defined as in the following table;

| Major variables of DVB-S2 LDPC code | $N_1 = 16200, K_1 = 7200, M_1 = 360, q = 25$ |
|---|---|
| Grouping of parity bits | Define a set $P_j$ satisfying characteristics for $0 \leq j < q = 25$: $P_j = \{p_k | k \equiv j \bmod 25, 0 \leq k < 9000\}$. $P_j$ is a set having 360 parity bits as its entries. |

| Range of $N_p$ | Puncturing Method |
|---|---|
| $0 \leq N_p < 9000$ | For an integer $m = \left\lfloor \dfrac{N_p}{360} \right\rfloor$, puncture all of parity bits corresponding to m parity bit sets $P_{\pi(0)}$, $P_{\pi(1)}, \ldots, P_{\pi(m-1)}$, and additionally puncture $(N_p - 360 \, m)$ parity bits among parity bits corresponding to $P_{\pi(m)}$. $\pi$ indicates a permutation function that is a puncturing pattern, and parity bits corresponding to parity bit sets are shown as follows. |

| $\pi(0)$ | $\pi(1)$ | $\pi(2)$ | $\pi(3)$ | $\pi(4)$ | $\pi(5)$ | $\pi(6)$ | $\pi(7)$ | $\pi(8)$ |
|---|---|---|---|---|---|---|---|---|
| 6 | 4 | 18 | 9 | 13 | 8 | 15 | 20 | 5 |
| $\pi(9)$ | $\pi(10)$ | $\pi(11)$ | $\pi(12)$ | $\pi(13)$ | $\pi(14)$ | $\pi(15)$ | $\pi(16)$ | $\pi(17)$ |
| 17 | 2 | 24 | 10 | 22 | 12 | 3 | 16 | 23 |
| $\pi(18)$ | $\pi(19)$ | $\pi(20)$ | $\pi(21)$ | $\pi(22)$ | $\pi(23)$ | $\pi(24)$ | — | — |
| 1 | 14 | 0 | 21 | 19 | 7 | 11 | — | — | where $N_1$ denotes a length of an LDPC codeword, $K_1$ denotes a length of an information word, $M_1$ denotes a length of one column group, and q is an integer satisfying $q=(N_1-K_1)/M_1$, where $K_1/M_1$ is an integer.

15. An apparatus for decoding a channel in a communication system using a Low-Density Parity-Check (LDPC) code, the apparatus comprising:
   a demodulator for demodulating a signal transmitted from a transmitter;
   a puncturing pattern decision unit for determining positions of punctured parity bits by estimating information on a puncturing pattern from the demodulated signal; and
   a decoder for decoding data using the determined positions of the punctured parity bits,
   wherein the puncturing pattern decision unit determines the positions of the punctured bits by determining a number of punctured bits, and determining positions of punctured bits corresponding to the determined number of the punctured bits in consideration of a predetermined interval, and
   wherein the predetermined interval is determined by dividing a length of the parity bits by a length of one column group in a parity-check matrix.

16. The apparatus of claim 15, wherein when puncturing is applied to an LDPC code with a codeword length of 16200 and an information length of 3240, the information on the puncturing pattern comprises a puncturing pattern defined as in the following table;

| Major variables of DVB-S2 LDPC code | $N_1 = 16200, K_1 = 3240, M_1 = 360, q = 36$ |
|---|---|
| Grouping of parity bits | Define a set $P_j$ satisfying characteristics for $0 \leq j < q = 36$: $P_j = \{p_k | k \equiv j \bmod 36, 0 \leq k < 12960\}$. $P_j$ is a set having 360 parity bits as its entries. |
| Range of $N_p$ | Puncturing Method |
| $0 \leq N_p < 12960$ | For an integer $m = \lfloor \frac{N_p}{360} \rfloor$, puncture all of parity bits corresponding to m parity bit sets $P_{\pi(0)}, P_{\pi(1)}, \ldots, P_{\pi(m-1)}$, and additionally puncture ($N_p$ − 360 m) parity bits among parity bits corresponding to $P_{\pi(m)}$. π indicates a permutation function that is a puncturing pattern, and parity bits corresponding to parity bit sets are shown as follows. |

| π(0) | π(1) | π(2) | π(3) | π(4) | π(5) | π(6) | π(7) | π(8) |
|---|---|---|---|---|---|---|---|---|
| 27 | 13 | 29 | 32 | 5 | 0 | 11 | 21 | 33 |
| π(9) | π(10) | π(11) | π(12) | π(13) | π(14) | π(15) | π(16) | π(17) |
| 20 | 25 | 28 | 18 | 35 | 8 | 3 | 9 | 31 |
| π(18) | π(19) | π(20) | π(21) | π(22) | π(23) | π(24) | π(25) | π(26) |
| 22 | 24 | 7 | 14 | 17 | 4 | 2 | 26 | 16 |
| π(27) | π(28) | π(29) | π(30) | π(31) | π(32) | π(33) | π(34) | π(35) |
| 34 | 19 | 10 | 12 | 23 | 1 | 6 | 30 | 15 | where $N_1$ denotes a length of an LDPC codeword, $K_1$ denotes a length of an information word, $M_1$ denotes a length of one column group, and q is an integer satisfying $q=(N_1-K_1)/M_1$, where $K_1/M_1$ is an integer.

17. The apparatus of claim 15, wherein when puncturing is applied to an LDPC code with a codeword length of 16200 and an information length of 7200, the information on the puncturing pattern comprises a puncturing pattern defined as in the following table.

| Major variables of DVB-S2 LDPC code | $N_1 = 16200, K_1 = 7200, M_1 = 360, q = 25$ |
|---|---|
| Grouping of parity bits | Define a set $P_j$ satisfying the following characteristics for $0 \leq j < q = 25$: $P_j = \{p_k | k \equiv j \bmod 25, 0 \leq k < 9000\}$. $P_j$ is a set having 360 parity bits as its entries. |
| Range of $N_p$ | Puncturing Method |
| $0 \leq N_p < 9000$ | For an integer $m = \lfloor \frac{N_p}{360} \rfloor$, puncture all of parity bits corresponding to m parity bit sets $P_{\pi(0)}, P_{\pi(1)}, \ldots, P_{\pi(m-1)}$, and additionally puncture ($N_p$ − 360 m) parity bits among parity bits corresponding to $P_{\pi(m)}$. π indicates a permutation function that is a puncturing pattern, and parity bits corresponding to parity bit sets are shown as follows. |

| π(0) | π(1) | π(2) | π(3) | π(4) | π(5) | π(6) | π(7) | π(8) |
|---|---|---|---|---|---|---|---|---|
| 6 | 4 | 18 | 9 | 13 | 8 | 15 | 20 | 5 |
| π(9) | π(10) | π(11) | π(12) | π(13) | π(14) | π(15) | π(16) | π(17) |
| 17 | 2 | 24 | 10 | 22 | 12 | 3 | 16 | 23 |
| π(18) | π(19) | π(20) | π(21) | π(22) | π(23) | π(24) | — | — |
| 1 | 14 | 0 | 21 | 19 | 7 | 11 | — | — | where $N_1$ denotes a length of an LDPC codeword, $K_1$ denotes a length of an information word, $M_1$ denotes a length of one column group, and q is an integer satisfying $q=(N_1-K_1)/M_1$, where $K_1/M_1$ is an integer.

* * * * *